(12) United States Patent
Lee et al.

(10) Patent No.: US 12,048,220 B2
(45) Date of Patent: Jul. 23, 2024

(54) DISPLAY DEVICE INCLUDING FIRST AND SECOND BLUE LIGHT EMITTING DIODES

(71) Applicant: Samsung Display Co., Ltd., Yongin-si (KR)

(72) Inventors: Taek Joon Lee, Hwaseong-si (KR); Sang Hee Yu, Hwaseong-si (KR); Jae Jin Lyu, Gwangju-si (KR); Seung Hee Jang, Cheonan-si (KR); Baek Hee Lee, Seoul (KR); Jun Woo Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 161 days.

(21) Appl. No.: 17/446,815

(22) Filed: Sep. 2, 2021

(65) Prior Publication Data

US 2022/0190041 A1    Jun. 16, 2022

(30) Foreign Application Priority Data

Dec. 11, 2020 (KR) .................. 10-2020-0173389

(51) Int. Cl.
*H01L 27/32* (2006.01)
*H01L 25/16* (2023.01)
*H10K 59/38* (2023.01)
*H01L 33/50* (2010.01)

(52) U.S. Cl.
CPC ........... *H10K 59/38* (2023.02); *H01L 25/167* (2013.01); *H01L 33/502* (2013.01)

(58) Field of Classification Search
CPC ...... H10K 59/38; H10K 50/19; H10K 50/865; H10K 50/00; H01L 25/167; H01L 33/502; H01L 33/20; H01L 33/504; H01L 25/0753; H01L 33/06; H01L 33/56; G02F 1/133624; G02F 1/133603
See application file for complete search history.

(56) References Cited

U.S. PATENT DOCUMENTS

| | | | |
|---|---|---|---|
| 9,935,153 B1* | 4/2018 | Jung | G02B 5/201 |
| 2012/0147295 A1* | 6/2012 | Kasano | G02F 1/133605 |
| | | | 257/E33.072 |
| 2013/0221323 A1* | 8/2013 | Kuo | H01L 33/005 |
| | | | 977/890 |
| 2015/0227002 A1* | 8/2015 | Won | G09G 3/34 |
| | | | 349/68 |
| 2016/0163768 A1* | 6/2016 | Song | H10K 59/38 |
| | | | 257/40 |

(Continued)

FOREIGN PATENT DOCUMENTS

| | | |
|---|---|---|
| JP | 2019-083203 A | 5/2019 |
| KR | 10-0852117 B1 | 8/2008 |

(Continued)

*Primary Examiner* — Tracie Y Green
(74) *Attorney, Agent, or Firm* — Lewis Roca Rothgerber Christie LLP

(57) ABSTRACT

A display device according to an embodiment includes a light emitting unit including a first light emitting diode to emit first blue light, a second light emitting diode to emit second blue light, the second blue light being different from the first blue light in central wavelength, and a quantum dot color conversion unit including a quantum dot color conversion layer on and overlapping the second light emitting diode.

19 Claims, 9 Drawing Sheets

(56) References Cited

U.S. PATENT DOCUMENTS

| | | | | |
|---|---|---|---|---|
| 2016/0190212 | A1* | 6/2016 | Takii | H10K 59/38 |
| | | | | 257/40 |
| 2017/0162553 | A1* | 6/2017 | Bibl | H01L 33/501 |
| 2018/0357948 | A1* | 12/2018 | Chen | G09G 3/32 |
| 2019/0140017 | A1* | 5/2019 | Chen | H01L 27/156 |
| 2019/0227431 | A1* | 7/2019 | Park | G03F 7/028 |
| 2020/0176516 | A1* | 6/2020 | Yan | H10K 71/00 |
| 2020/0357853 | A1* | 11/2020 | Yan | H10K 59/38 |
| 2020/0381588 | A1* | 12/2020 | Thompson | H01L 33/405 |
| 2020/0381596 | A1* | 12/2020 | Choi | H01L 33/504 |
| 2021/0328113 | A1* | 10/2021 | Tydtgat | H01L 27/156 |
| 2022/0302229 | A1* | 9/2022 | Yue | H10K 50/858 |

FOREIGN PATENT DOCUMENTS

| | | |
|---|---|---|
| KR | 10-1415566 B1 | 7/2014 |
| KR | 10-1584663 B1 | 1/2016 |
| KR | 10-1636052 B1 | 7/2016 |
| KR | 10-1636441 B1 | 7/2016 |
| KR | 10-1718066 B1 | 3/2017 |
| KR | 10-1983426 B1 | 9/2019 |
| KR | 10-2078679 B1 | 2/2020 |
| KR | 10-2020-0047333 A | 5/2020 |
| KR | 10-2020-0053869 A | 5/2020 |
| KR | 10-2112638 B1 | 5/2020 |

* cited by examiner

FIG. 1
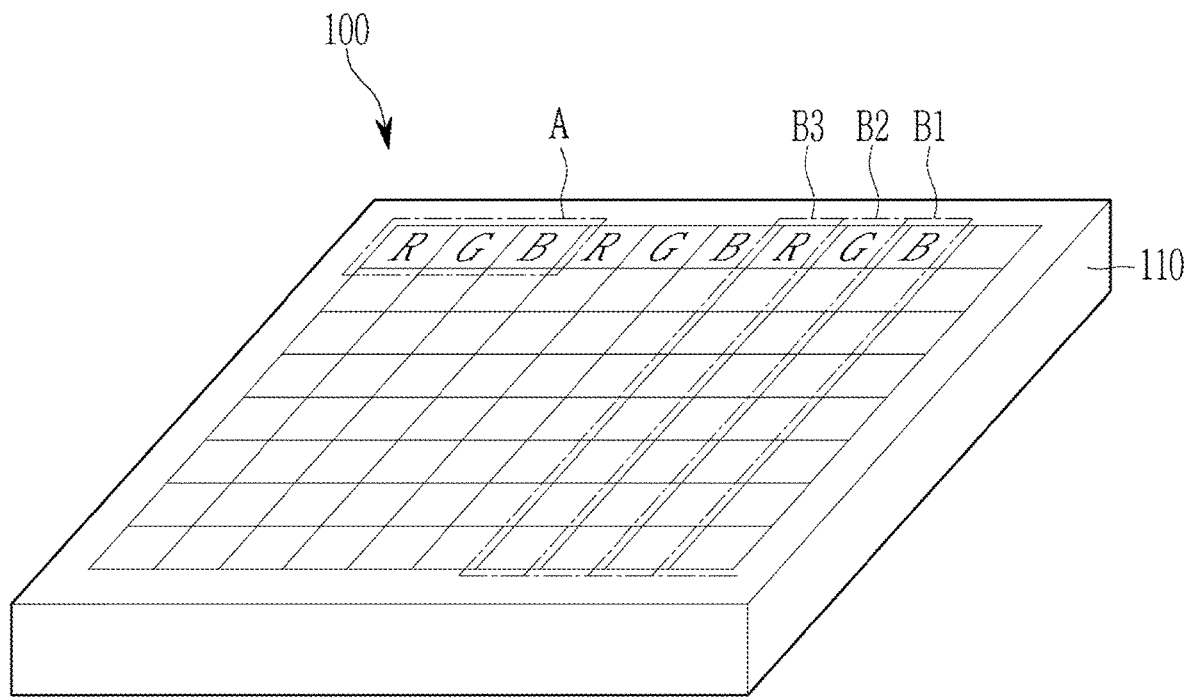
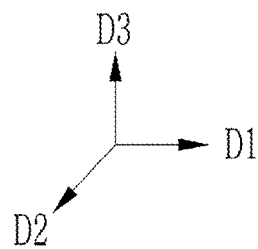

DISPLAY DEVICE INCLUDING FIRST AND SECOND BLUE LIGHT EMITTING DIODES

CROSS-REFERENCE TO RELATED APPLICATION

This application claims priority to and the benefit of Korean Patent Application No. 10-2020-0173389, filed in the Korean Intellectual Property Office on Dec. 11, 2020, the entire content of which is hereby incorporated by reference.

BACKGROUND

1. Field

The present disclosure relates to a display device.

2. Description of the Related Art

A light emitting display device includes light emitting diodes corresponding to pixels, and the light emitting display device may display an image by controlling the luminance of each light emitting diode. Unlike a light-receiving display device such as a liquid crystal display, the light emitting display device does not require a light source such as a backlight, and thus the thickness and weight may be reduced. In addition, the light emitting display device has characteristics such as high luminance, high contrast ratio, high color reproduction, and high response rate, and thus, may display a high-quality image.

Due to these advantages, light emitting display devices are applied to various suitable electronic devices, for example, mobile devices (such as smart phones and tablets), monitors, and televisions, and are in demand and in the spotlight as display devices for automobiles.

SUMMARY

Aspects of embodiments are directed towards a display device with increased photoconversion efficiency of a quantum dot color conversion layer.

A display device according to an embodiment includes a light emitting unit including a first light emitting diode to emit first blue light, and a second light emitting diode to emit second blue light, the second blue light being different from the first blue light in central wavelength, and a quantum dot color conversion unit including a quantum dot color conversion layer on and overlapping the second light emitting diode.

The second blue light may be shorter in central wavelength than the first blue light.

The central wavelength of the first blue light may be about 450 nm to about 460 nm.

The central wavelength of the second blue light may be about 390 nm to about 450 nm.

The first light emitting diode and second light emitting diode may each be an organic light emitting diode, a micro-light-emitting diode, or a nano-light-emitting diode.

The organic light emitting diode may include an organic light emitting layer, a first charge transfer region (e.g., an anode) on a first surface of the organic light emitting layer, and a second charge transfer region (e.g., a cathode) on a second surface of the organic light emitting layer, the second surface facing oppositely away from the first surface.

The micro-light-emitting diode may include a first conductive type (e.g., kind) of semiconductor layer, a second conductive type (e.g., kind) of semiconductor layer overlapping the first conductive type of semiconductor layer, and an active layer between the first conductive type of semiconductor layer and the second conductive type of semiconductor layer.

The nano-light-emitting diode may be a nano-sized rod-shaped light emitting diode.

The light emitting unit may include a third light emitting diode to emit third blue light.

The central wavelength of the third blue light may be about 450 nm to about 460 nm, or about 390 nm to about 450 nm.

The quantum dot color conversion unit may include a first quantum dot color conversion layer to convert second blue light into third light, and a second quantum dot color conversion layer to convert second blue light into fourth light.

The third light may be green light, and the fourth light may be red light.

The quantum dot color conversion layer may include a quantum dot including (e.g., being) a Group II-VI semiconductor compound, a Group III-V semiconductor compound, a Group III-VI semiconductor compound, a Group semiconductor compound, a Group IV-VI semiconductor compound, a Group I-II-IV-VI semiconductor compound, a Group IV element, a IV Group compound, or a combination thereof.

The quantum dot may include (e.g., be) InP, InZnP, InGaP, ZnS, ZnSe, ZnSeS, ZnSeTe, or a combination thereof.

The quantum dot may include a core including (e.g., being) a first semiconductor nanocrystal, and a shell on the core and including (e.g., being) a second semiconductor nanocrystal, the second semiconductor nanocrystal being different in composition from the first semiconductor nanocrystal.

The quantum dot may include (e.g., be) ZnSe, ZnS, ZnSeS, ZnSeTe, or a combination thereof in an outermost layer of the shell.

The quantum dot color conversion unit may further include a transmission layer overlapping the first light emitting diode and not including a quantum dot color conversion material.

The quantum dot color conversion unit may further include a partition wall between a plurality of quantum dot color conversion layers including the quantum dot color conversion layer, the partition wall separating the plurality of quantum dot color conversion layers from each other.

The display device may further include an organic planarization layer (e.g., an overcoat layer) on the quantum dot color conversion unit.

The display device may further include a color filter unit including a color filter on the quantum dot color conversion unit and overlapping the quantum dot color conversion layer.

According to embodiments, it is possible to provide a display device with increased photoconversion efficiency and panel reliability of a quantum dot color conversion layer without deteriorating a blue color coordinate.

BRIEF DESCRIPTION OF THE DRAWINGS

The accompanying drawings, which are incorporated in and constitute a part of this specification, illustrate embodiments of the present disclosure. The drawings, together with the description, serve to better explain aspects and principles of the present disclosure.

FIG. 1 is a schematic perspective view of a display device according to an embodiment.

DETAILED DESCRIPTION

Figure 2:
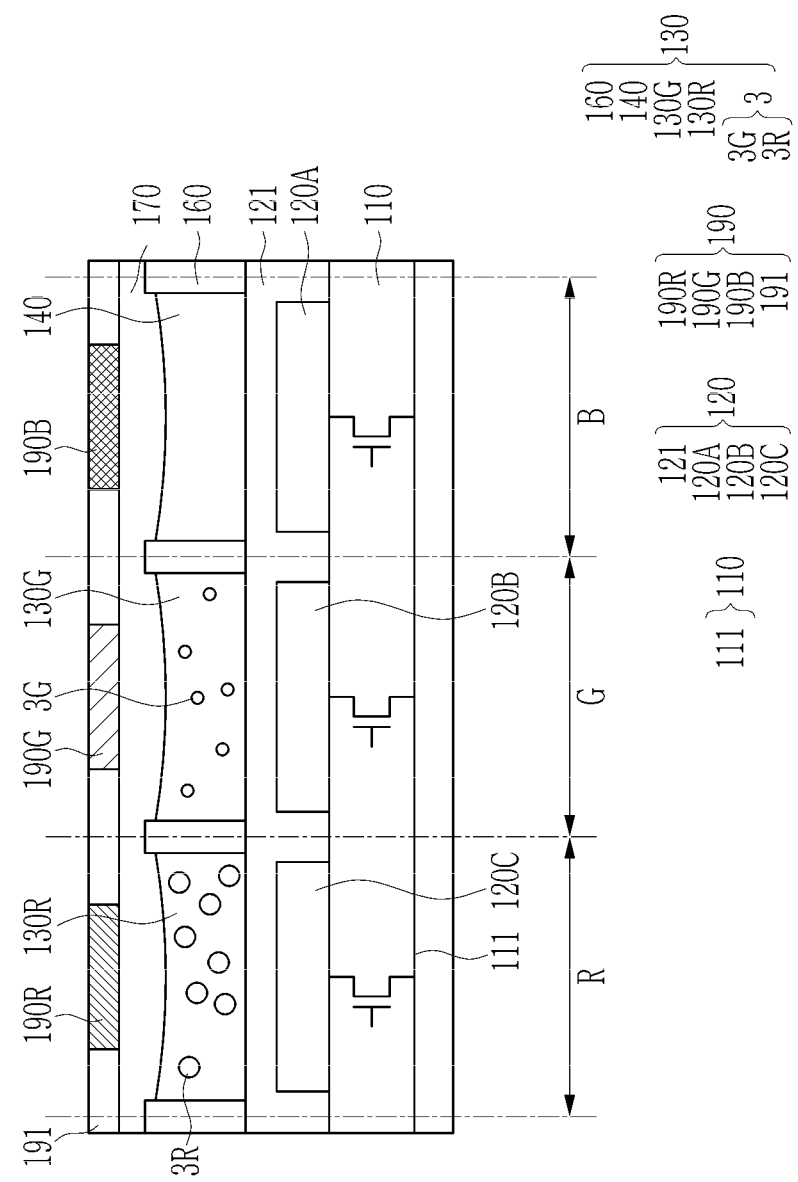
FIG. 2 is a schematic cross-sectional view of a display device according to an embodiment.

The embodiments will be described in more detail with reference to the accompanying drawings so that those of ordinary skill in the art may easily implement the embodiments. As used herein, the use of the term "may," when describing embodiments of the present disclosure, refers to "one or more embodiments of the present disclosure." As used herein, the term "and/or" includes any and all combinations of one or more of the associated listed items.

The size and thickness of each component shown in the drawings may be arbitrarily shown or exaggerated for convenience of description.

It will be understood that when an element such as a layer, film, region, or substrate is referred to as being "on" another element, it can be directly on the other element or one or more intervening element(s) may also be present. Conversely, when an element is referred to as being "directly on" another element, there are no intervening elements present.

As used herein, the terms "substantially," "about," "approximately," and similar terms are used as terms of approximation and not as terms of degree, and are intended to account for the inherent deviations in measured or calculated values that would be recognized by those of ordinary skill in the art. Also, the terms "about," "approximately," and similar terms, when used herein in connection with a numerical value or a numerical range, are inclusive of the stated value and mean within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In the present specification, unless described to the contrary, the word "comprise" and variations such as "comprises" or "comprising" will be understood to imply the inclusion of stated elements but not the exclusion of any other elements.

As used herein, when a definition is not otherwise provided, "substituted" refers to replacement of at least one hydrogen of a compound or a corresponding moiety by a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, "Group" refers to a group of the Periodic Table.

As used herein, "Group I" may include Group IA and Group IB, and examples of Group I metals may include (e.g., be) Li, Na, K, Rb, and Cs, but are not limited thereto.

As used herein, "Group II" may include Group IIA and Group IIB, and examples of Group II metals may include (e.g., be) Cd, Zn, Hg, and Mg, but are not limited thereto.

As used herein, "Group III" may include Group IIIA and Group IIIB, and examples of Group III metals may include (e.g., be) Al, In, Ga, and Tl, but are not limited thereto.

As used herein, "Group IV" may include Group IVA and Group IVB, and examples of Group IV metals may include (e.g., be) Si, Ge, and Sn, but are not limited thereto. As used herein, "metal" may include a semi-metal such as Si.

As used herein, "Group V" may include Group VA, and examples may include (e.g., be) nitrogen (N), phosphorus (P), arsenic (As), antimony (Sb), and bismuth (Bi), but is not limited thereto.

"Group VI" includes group VIA, and examples may include (e.g., be) sulfur (S), selenium (Se), and tellurium (Te), but is not limited thereto.

Hereinafter, a display device 1 according to an embodiment will be described with reference to FIGS. 1 and 2.

FIG. 1 is a schematic perspective view of a display device 100 according to an embodiment, and FIG. 2 is a schematic cross-sectional view of a region A in FIG. 1.

Referring to FIG. 1, the display device 1 includes a plurality of pixels B, G, and R, and each of the pixels B, G, and R may selectively emit light of blue B, green G, and red R. As an example, the display device 1 may include three pixels of a first pixel B, a second pixel G, and a third pixel R. The first pixel B may be a blue pixel, the second pixel G may be a green pixel, and the third pixel R may be a red pixel.

The plurality of pixels B, G, and R arranged along the D2 direction may emit the same color. For example, a plurality of first pixels B along B1 (e.g., arranged with each other along B1 in the D2 direction) may emit blue light, a plurality of second pixels G along B2 (e.g., arranged with each other along B2 in the D2 direction) may emit green light, and a plurality of third pixels R along B3 (e.g., arranged with each other along B3 in the D2 direction) may emit red light. In addition, a plurality of first pixels B included in B1 may be electrically coupled (e.g., connected) to each other, a plurality of second pixels G included in B2 may be electrically coupled (e.g., connected) to each other, and a plurality of third pixels R included in B3 may be electrically coupled (e.g., connected) to each other. However, the present disclosure is not limited to the above-described examples, and the plurality of first, second, and third pixels B, G, and R may be arranged in any suitable configuration or pattern.

Hereinafter, a region 100 of the display device 1 in FIG. 1 will be described with reference to FIG. 2, which is a cross-sectional view taken along directions D1 and D3 (D1×D3). For example, FIG. 2 is a cross-sectional view of a plane parallel to directions D1 and D3 in the region 100.

Referring to FIG. 2, the display device 1 includes a substrate 110, a light emitting unit 120 including a plurality of light emitting diodes 120A, 120B, and 120C on the substrate 110, and a quantum dot color conversion unit 130 on the light emitting unit 120.

The substrate 110 may be a transparent substrate including (e.g., being) glass and/or plastic. In addition, the transparent substrate may include (e.g., be) sapphire ($Al_2O_3$), gallium nitride (GaN), silicon carbide (SiC), gallium oxide ($Ga_2O_3$), lithium gallium oxide ($LiGaO_2$), lithium aluminum oxide ($LiAlO_2$), and/or magnesium aluminum oxide ($MgAl_2O_4$) according to embodiments.

Also, the substrate 110 may be a flexible substrate. For example, the substrate 110 may include (e.g., be) a plastic having excellent heat resistance and/or durability such as polyimide, polyethylene terephthalate (PET), polycarbonate, polyethylene naphthalate, polyarylate (PAR), polyetherimide, or a combination thereof.

The substrate 110 may include a pixel circuit unit 111 that supplies power such as a current (e.g., via a current) to each of the light emitting diodes 120A, 120B, and 120C corresponding to the pixels B, G, and R, on an upper portion (e.g., upper surface) of the substrate 110 and/or inside the substrate 110, and controls the light emitting diodes 120A, 120B, and 120C. In some embodiments, the pixel circuit unit 111 may be on an upper portion of the substrate 110 and/or inside the substrate 110. In some embodiments, the pixel circuit unit 111 may control the light emitting diodes 120A, 120B, and 120C. In FIG. 2, for effective understanding, the pixel circuit unit 111 is illustrated utilizing (e.g., using) a transistor circuit.

A light emitting unit 120 including a plurality of light emitting diodes 120A, 120B, and 120C may be disposed on the substrate 110 corresponding to the pixels B, G, and R. The plurality of light emitting diodes 120A, 120B, and 120C may emit light by an applied power source and/or a driving signal. The plurality of light emitting diodes 120A, 120B, and 120C may include a first light emitting diode 120A in the first pixel B of the display device 1, a second light emitting diode 120B in the second pixel G of the display device 1, and a third light emitting diode 120C in the third pixel R of the display device 1.

The plurality of light emitting diodes 120A, 120B, and 120C may each emit blue light. For example, the central wavelength of light emitted from the plurality of light emitting diodes 120A, 120B, and 120C may be about 390 nm to about 460 nm.

In this case, the first light emitting diode 120A may emit first blue light, and the second light emitting diode 120B may emit second blue light having a different central wavelength from the first blue light.

For example, the central wavelength of the second blue light may be shorter than the central wavelength of the first blue light. As will be described later, the first blue light emitted by the first light emitting diode 120A passes through a transmission layer 140, and the second blue light emitted by the second light emitting diode 120B is color-converted by a quantum dot color conversion layer 130G disposed on the second light emitting diode 120B to be overlapped with (e.g., overlapping) the second light emitting diode 120B. For example, the second blue light utilizes (e.g., uses) a relatively short wavelength to increase the photoconversion efficiency and color purity of the quantum dot color conversion layer 130G, and the first blue light that passes through the transmission layer 140 and is to enter the eye of an observer utilizes (e.g., uses) a relatively long wavelength to avoid harming the observer's eye health.

Figure 3:
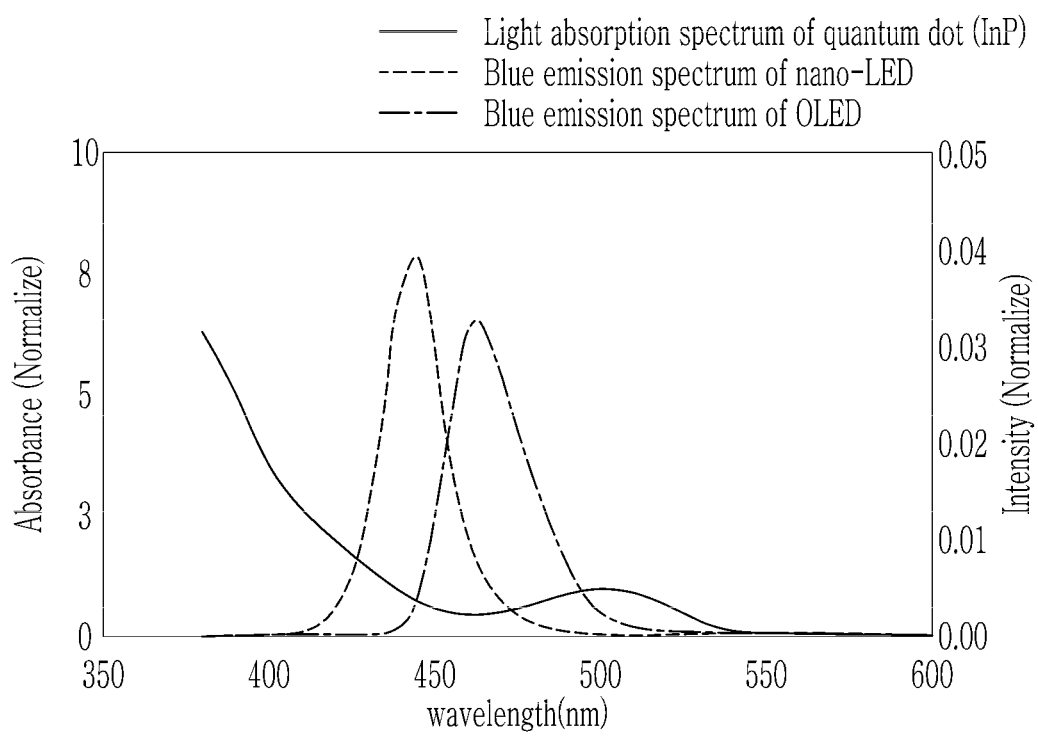
FIG. 3 is a graph showing an example of a light absorption spectrum of a quantum dot and blue emission spectra of an OLED and a nano-LED.
Figure 4:
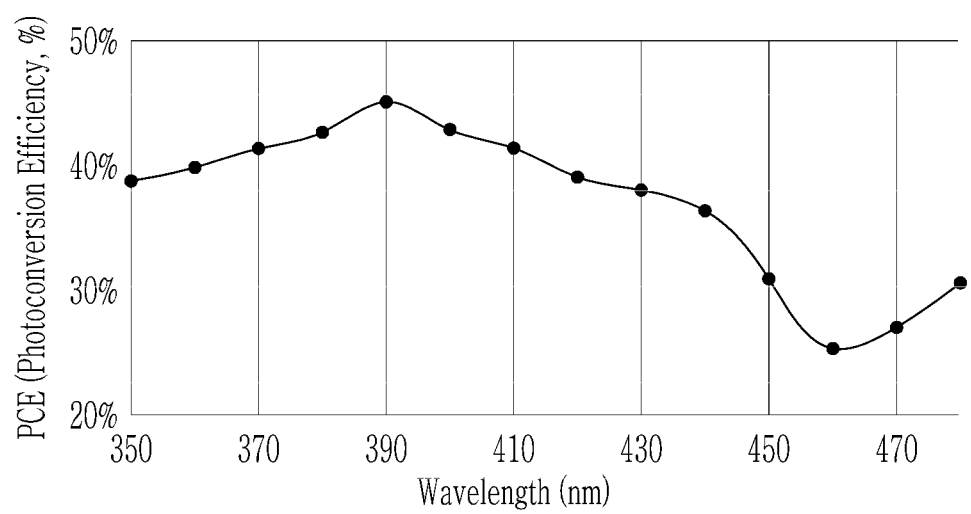
FIG. 4 is a graph showing an example of photoconversion efficiency of a quantum dot depending on a central wavelength of a blue light source.

FIG. 3 is a graph showing an example of a light absorption spectrum of a green quantum dot (InP) including (e.g., being) indium and phosphorus and a blue emission spectra of an OLED and a nano-LED (averaging from 0 degrees to 60 degrees), and FIG. 4 is a graph showing an example of the photoconversion efficiency of the quantum dot (InP) depending on the central wavelength of the blue light source.

Referring to FIG. 3, the light absorption spectrum in the blue light region of the quantum dot (InP) is a downward curve, which shows that the shorter the central wavelength of blue light, the higher the light absorption rate. In fact, when an OLED emitting blue light with a central wavelength of about 462 nm is utilized (e.g., used) as a light source, the blue light absorption rate of the quantum dot (InP) is about 77.5%, the photoconversion efficiency is about 26.7%, and the full width at half maximum (FWHM) of the emission wavelength is about 28 nm. In contrast, when a nano-LED emitting blue light with a central wavelength of about 444 nm is utilized (e.g., used) as a light source, the absorption rate of blue light of the quantum dot (InP) is about 85.1%, the photoconversion efficiency is increased to about 31.5%, and the FWHM of the emission wavelength is decreased to about 21 nm.

Therefore, when the second blue light utilizes (e.g., uses) blue light having a shorter wavelength than the first blue light, the photoconversion efficiency and color purity of the quantum dot color conversion layer increase without deteriorating the blue color coordinate and harming eye health, and thus a display device having increased panel reliability may be provided.

For example, the central wavelength of the first blue light may be about 450 nm to about 460 nm.

For example, the central wavelength of the second blue light may be about 390 nm to about 450 nm, for example, about 400 nm to about 445 nm.

Meanwhile, the third light emitting diode 120C may emit third blue light. The central wavelength of the third blue light may be the same as or different from the first blue light and/or the second blue light. For example, the central wavelength of the third blue light may be about 450 nm to about 460 nm, or may be about 390 nm to about 450 nm.

For example, each of the light emitting diodes 120A, 120B, and 120C may be an organic light emitting diode, a micro-light-emitting diode (μ-LED), and/or a nano-light-emitting diode (nano-LED).

Figure 5:
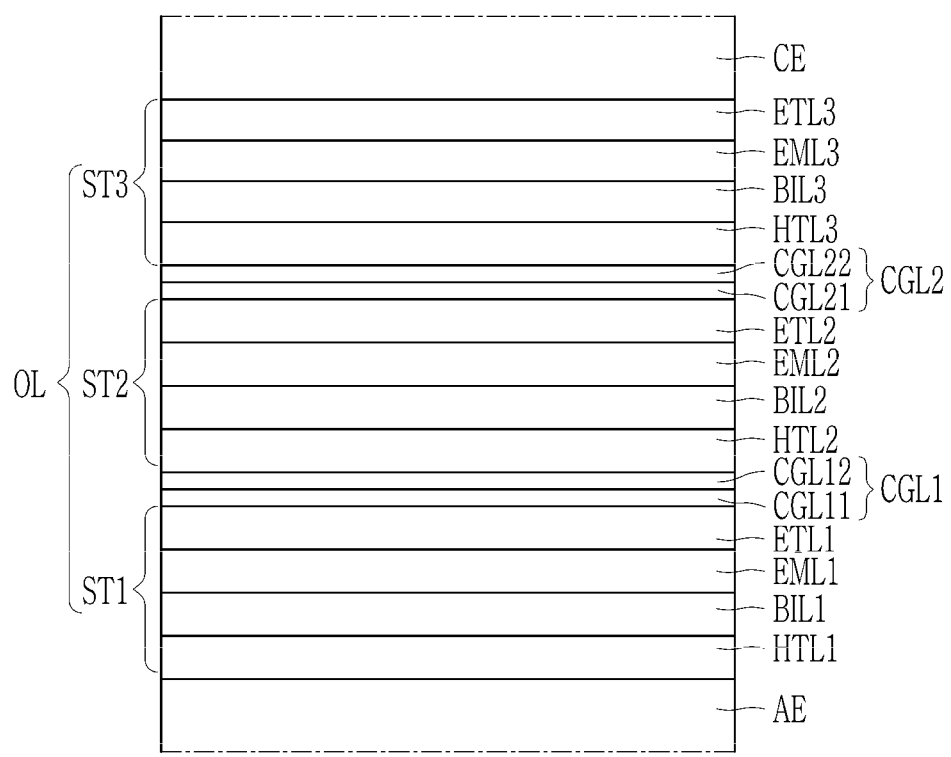
FIG. 5 is a cross-sectional view illustrating an example of an organic light emitting diode.

FIG. 5 is a cross-sectional view illustrating an example of an organic light emitting diode.

Referring to FIG. 5, the organic light emitting diode may include a light emitting layer OL between an anode AE (or a first charge transfer region) and a cathode CE (or a second charge transfer region).

The anode AE may be a reflective electrode, and in this case, the anode AE may be a metal layer including (e.g., being) one or more metals such as silver (Ag), magnesium (Mg), aluminum (Al), platinum (Pt), palladium (Pd), gold (Au), nickel (Ni), neodymium (Nd), iridium (Ir), and/or chromium (Cr). In addition, the anode AE may further include a metal oxide layer stacked on the metal layer. For example, the anode AE may have a bilayer structure of ITO/Ag, Ag/ITO, ITO/Mg, or ITO/MgF, or a multilayer structure such as ITO/Ag/ITO.

The cathode CE may have semi-transmissive or transmissive properties. When the cathode CE has semi-transmissive properties, the cathode CE may include (e.g., be) Ag, Mg, copper (Cu), Al, Pt, Pd, Au, Ni, Nd, Ir, Cr, lithium (Li), calcium (Ca), LiF/Ca, LiF/Al, molybdenum (Mo), titanium (Ti), a compound thereof, or a mixture thereof, for example a mixture of Ag and Mg. In addition, when the thickness of the cathode CE is tens to hundreds of angstroms, the cathode CE may have semi-transmissive properties.

When the cathode CE has transparency, the cathode CE may include (e.g., be) a transparent conductive oxide (TCO). For example, the cathode CE may include (e.g., be) $W_xO_x$ (tungsten oxide), $TiO_2$ (titanium oxide), ITO (indium tin oxide), IZO (indium zinc oxide), ZnO (zinc oxide), ITZO (indium tin zinc oxide), and/or MgO (magnesium oxide).

The light emitting layer OL is disposed between the anode AE and the cathode CE. For example, the organic light emitting diode may have a tandem structure.

The light emitting layer OL may include a first stack ST1 including a first light emitting layer EML1, a second stack ST2 disposed on the first stack ST1 and including a second light emitting layer EML2, a third stack ST3 disposed on a second stack ST2 and including a third light emitting layer EML3, a first charge generation layer CGL1 between the first stack ST1 and the second stack ST2, and a second charge generation layer CGL2 between the second stack ST2 and the third stack ST3. The first stack ST1, the second stack ST2, and the third stack ST3 may be disposed to be overlapped with (e.g., may overlap) each other.

The first light emitting layer EML1, the second light emitting layer EML2, and the third light emitting layer EML3 may be disposed to be overlapped with each other.

Light emitted by each of the first light emitting layer EML1, the second light emitting layer EML2, and the third light emitting layer EML3 may have a peak wavelength of less than about 610 nm. In some embodiments, each of the first light emitting layer EML1, the second light emitting layer EML2, and the third light emitting layers EML3 do not emit light having a peak wavelength of greater than or equal to about 610 nm and less than or equal to about 680 nm, such as red light, and, for example, may emit blue light.

For example, the first light emitting layer EML1, the second light emitting layer EML2, and the third light emitting layer EML3 may each include (e.g., be) a host and a dopant. The host is not particularly limited as long as it is a commonly utilized (e.g., used) or generally available material, but may include (e.g., be), for example, Alq3 (tris(8-hydroxyquinolino)aluminum), CBP (4,4'-bis(N-carbazolyl)-1,1'-biphenyl), PVK (poly(n-vinylcarbazole)), AND (9,10-di(naphthalene-2-yl)anthracene), TCTA (4,4',4"-tris(carbazol-9-yl)-triphenylamine), TPBi (1,3,5-tris(N-phenylbenzimidazole-2-yl)benzene), TBADN (3-tert-butyl-9,10-di(naphth-2-yl)anthracene), DSA (distyrylarylene), CDBP (4,4'-bis(9-carbazolyl)-2,2"-dimethyl-biphenyl), and/or MADN (2-methyl-9,10-bis(naphthalen-2-yl)anthracene).

The first light emitting layer EML1, the second light emitting layer EML2, and the third light emitting layer EML3 which emit blue light may include (e.g., be), for example, spiro-DPVBi, spiro-6P, DSB (distyryl-benzene), DSA (distyryl-arylene), a PFO (polyfluorene)-based polymer, and a PPV (poly(p-phenylene vinylene))-based polymer. As another example, a phosphorescent material including (e.g., being) an organometallic complex such as (4,6-F2ppy)2Irpic may be included in the first light emitting layer EML1, the second light emitting layer EML2, and the third light emitting layer EML3.

As an example, when applying the organic light emitting diode to the first light emitting diode 120A configured to emit first blue light, all the first light emitting layer EML1, the second light emitting layer EML2, and the third light emitting layer EML3 may emit the first blue light, or a combination of light emitted from each of the first light emitting layer EML1, the second light emitting layer EML2, and the third light emitting layer EML3 may emit (e.g., may provide or constitute) the first blue light. In addition, when applying the organic light-emitting device to the second light-emitting diode 120B configured to emit the second blue light, the first light emitting layer EML1, the second light emitting layer EML2, and the third light emitting layer EML3 may (e.g., may each) emit the second blue light, or a combination of light emitted from each of the first light emitting layer EML1, the second light emitting layer EML2, and the third light emitting layer EML3 may emit (e.g., provide or constitute) the second blue light.

Meanwhile, in the present disclosure, the tandem structure of the organic light emitting diode is not limited thereto, and the organic light emitting diode may further include a fourth stack including a fourth light emitting layer. The fourth stack may be disposed between the anode AE and the first stack, and a third charge generation layer may be disposed between the fourth stack and the first stack ST1.

When the organic light emitting diode further includes the fourth light emitting layer, for example, the fourth light emitting layer may emit green light, and the first light emitting layer EML1, the second light emitting layer EML2, and the third light emitting layer EML3 may emit blue light. Similarly, in this case, a combination of light emitted from each of the first light emitting layer EML1, the second light emitting layer EML2, and the third light emitting layer EML3 may be combined to emit (e.g., to provide or constitute) the first blue light or the second blue light, and by further including the fourth light emitting layer, an insufficient amount of green light may be compensated.

The first charge generation layer CGL1 may be disposed between the first stack ST1 and the second stack ST2. The first charge generation layer CGL1 may serve to inject electric charges into each light emitting layer. The first charge generation layer CGL1 may play a role of controlling a charge balance between the first stack ST1 and the second stack ST2. The first charge generation layer CGL1 may include an n-type (e.g., n-doped) charge generation layer CGL11 and a p-type (e.g., p-doped) charge generation layer CGL12. The p-type charge generation layer CGL12 may be disposed on the n-type charge generation layer CGL11, and the p-type charge generation layer CGL12 may be disposed between the n-type charge generation layer CGL11 and the second stack ST2.

The first charge generation layer CGL1 may have a junction structure of the n-type charge generation layer CGL11 and the p-type charge generation layer CGL12. The n-type charge generation layer CGL11 supplies electrons to the first light emitting layer EML1, and the p-type charge generation layer CGL12 supplies holes to the second light emitting layer EML2 included in the second stack ST2. The first charge generation layer CGL1 may be disposed between the first stack ST1 and the second stack ST2 to provide electric charges to each of the light emitting layers (e.g., to at least each of the first and second light emitting layers EML1 and EML2), thereby increasing luminous efficiency and lowering a driving voltage.

The first stack ST1 may further include a first hole transport layer HTL1, a first electron blocking layer BIL1, and a first electron transport layer ETL1.

The first hole transport layer HTL1 serves to facilitate transport of holes, and may include (e.g., be) a hole transport material. The hole transport material may include (e.g., be) a carbazole-based derivative such as N-phenylcarbazole and/or polyvinylcarbazole, a fluorine-based derivative, a triphenylamine-based derivative such as TPD (N,N'-bis(3-methylphenyl)-N,N'-diphenyl-[1,1-biphenyl]-4,4'-diamine) and/or TCTA (4,4',4''-tris(N-carbazolyl)triphenylamine), NPB (N,N'-di(1-naphthyl)-N,N'-diphenylbenzidine), TAPC (4,4'-cyclohexylidene bis[N,N-bis(4-methylphenyl)benzenamine]), and/or the like, but is not limited thereto.

The first electron blocking layer BIL1 may be disposed on the first hole transport layer HTL1, and the first electron blocking layer BIL1 may be disposed between the first hole transport layer HTL1 and the first light emitting layer EML1. The first electron blocking layer BIL1 may include (e.g., be) an electron blocking material. In some embodiments, the first electron blocking layer BIL1 may include (e.g., be) or may further include (e.g., further be) a metal and/or a metal compound to prevent or block electrons generated in the first light emitting layer EML1 from passing to the first hole transport layer HTL1. For example, the aforementioned first hole transport layer HTL1 and first electron blocking layer BIL1 may be formed of a single layer in which respective materials are included (e.g., mixed).

The first electron transport layer ETL1 may be disposed on the first light emitting layer EML1, and may be disposed between the first charge generation layer CGL1 and the first light emitting layer EML1. For example, the first electron transport layer ETL1 may include (e.g., be) an electron transport material such as Alq3 (tris(8-hydroxyquinolinato) aluminum), TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), Bebq2 (beryllium bis(benzoquinolin-10-olate), ADN (9,10-di(naphthalene-2-yl)anthracene), and/or a mixture thereof. However, the present disclosure is not limited to the type (e.g., kind) of the electron transport material.

The second stack ST2 may be disposed on the first charge generation layer CGL1, and may further include a second hole transport layer HTL2, a second electron blocking layer BIL2, and a second electron transport layer ETL2.

The second hole transport layer HTL2 may be disposed on the first charge generation layer CGL1. The second hole transport layer HTL2 may be made of the same material as the first hole transport layer HTL1, or the second hole transport layer HTL2 may include (e.g., be) at least one material selected from the materials that may be included in the first hole transport layer HTL1.

The second electron blocking layer BIL2 may be disposed on the second hole transport layer HTL2, and may be disposed between the second hole transport layer HTL2 and the second light emitting layer EML2. The second electron blocking layer BIL2 may have the same material and the same structure as the first electron blocking layer BIL1, or the second electron blocking layer BIL2 may include (e.g., be) at least one material selected from the materials that may be included in the first electron blocking layer BIL1.

The second electron transport layer ETL2 may be disposed on the second light emitting layer EML2, and the second electron transport layer ETL2 may be disposed between the second charge generation layer CGL2 and the second light emitting layer EML2. The second electron transport layer ETL2 may have the same material and the same structure as the first electron transport layer ETL1, or the second electron transport layer ETL2 may include (e.g., be) one or more materials selected from materials that may be included in the first electron transport layer ETL1.

The second charge generation layer CGL2 may be disposed on the second stack ST2 and between the second stack ST2 and the third stack ST3.

The second charge generation layer CGL2 may have the same structure as the aforementioned first charge generation layer CGL1. For example, the second charge generation layer CGL2 may include an n-type (e.g., n-doped) charge generation layer CGL21 disposed closer to the second stack ST2, and a p-type (e.g., p-doped) charge generation layer CGL22 disposed closer to the cathode CE. The p-type charge generation layer CGL22 may be disposed on the n-type charge generation layer CGL21. For example, the n-type charge generation layer CGL21 may be between the p-type charge generation layer CGL22 and the second stack ST2, and the p-type charge generation layer CGL22 may be between the third stack ST3 and the n-type charge generation layer CGL21.

The second charge generation layer CGL2 may have a structure in which the n-type charge generation layer CGL21 and the p-type charge generation layer CGL22 are in contact with each other. The first charge generation layer CGL1 and the second charge generation layer CGL2 may be formed of different materials or may be formed of the same material.

The third stack ST3 may be disposed on the second charge generation layer CGL2, and the third stack ST3 may further include a third hole transport layer HTL3 and a third electron transport layer ETL3. In some embodiments, the third stack ST3 may further include a third electron blocking layer BIL3.

The third hole transport layer HTL3 may be disposed on the second charge generation layer CGL2. The third hole transport layer HTL3 may be made of the same material as the first hole transport layer HTL1, or the third hole transport layer HTL3 may include (e.g., be) at least one material selected from the materials that may be included in the first hole transport layer HTL1.

In some embodiments, the third electron blocking layer BIL3 may be disposed on the third hole transport layer HTL3. The third electron blocking layer BIL3 may be made of the same material as the first electron blocking layer BIL1, or the third electron blocking layer BIL3 may include (e.g., be) at least one material selected from the materials that may be included in the first electron blocking layer BIL1.

The third electron transport layer ETL3 may be disposed on the third light emitting layer EML3, and the third electron transport layer ETL3 may be disposed between the cathode CE and the third light emitting layer EML3. The third electron transport layer ETL3 may be formed of the same material and may have the same structure as the first electron transport layer ETL1, or the third electron transport layer ETL3 may include (e.g., be) one or more materials selected from materials that may be included in the first electron transport layer ETL1.

Figure 6:
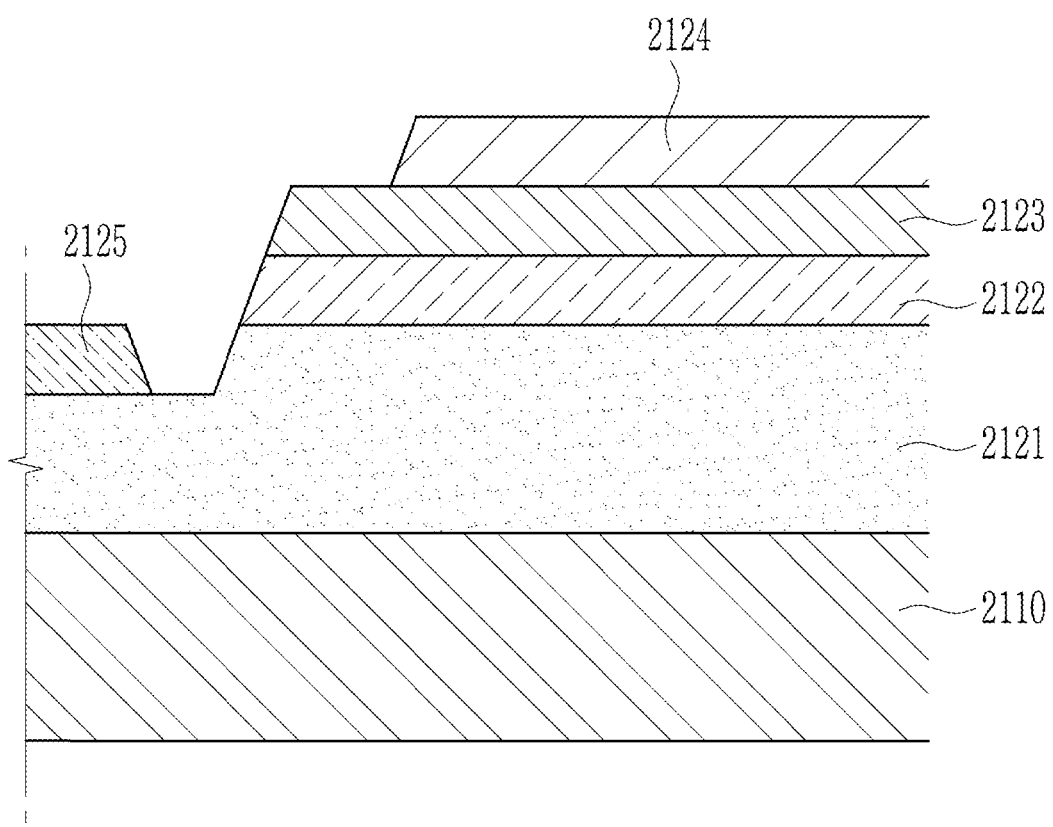
FIG. 6 is a cross-sectional view illustrating an example of a micro-light-emitting diode.

FIG. 6 is a cross-sectional view illustrating an example of a micro-light-emitting diode.

Referring to FIG. 6, the micro-light-emitting diode includes a first conductive type (e.g., kind) of semiconductor layer 2121 on a substrate 2110, an active layer 2122 on the first conductive type of semiconductor layer 2121, and a second conductive type (e.g., kind) of semiconductor layer 2123 disposed on the active layer 2122 and overlapped with the first conductive type of semiconductor layer 2121.

The first conductive type of semiconductor layer 2121 may be an n-type (e.g., n-doped) semiconductor layer, and the second conductive type of semiconductor layer 2123 may be a p-type (e.g., p-doped) semiconductor layer. In addition, the first conductive type of semiconductor layer 2121 and the second conductive type of semiconductor layer 2123 may include (e.g., be) a nitride semiconductor. The first conductive type of semiconductor layer 2121 and the second conductive type of semiconductor layer 2123 may have an $Al_xIn_yGa_{(1-x-y)}N$ formula, wherein $0 \le x \le 1$, $0 \le y \le 1$, and $0 \le x \le y \le 1$. The first conductive type of semiconductor layer 2121 and the second conductive type of semiconductor layer 2123 may include (e.g., be) one or more materials selected from GaN, AlGaN, and InGaN.

The first conductive type of semiconductor layer 2121 may include (e.g., be) an n-type doped (e.g., n-doped) nitride semiconductor material, and the second conductive type of semiconductor layer 2123 may include (e.g., be) a p-type doped (e.g., p-doped) nitride semiconductor material. For example, the first conductive type of semiconductor layer 2121 may include (e.g., be) n-type doped GaN (e.g., n-doped GaN), and the second conductive type of semiconductor layer 2123 may include (e.g., be) p-type doped GaN (e.g., p-doped GaN).

The active layer 2122 emits light having a set or predetermined energy by recombination of electrons and holes, and the active layer 2122 may have a multiple quantum well (MQW) structure in which a quantum well layer and a quantum barrier layer are alternately stacked with each other. In the case of a multiple quantum well structure, it may have an InGaN/GaN structure. The first conductive type of semiconductor layer 2121, the active layer 2122, and the second conductive type of semiconductor layer 2123 may be epitaxial layers.

The first conductive type of semiconductor layer 2121 may be coupled (e.g., connected) to a first electrode 2125, and the second conductive type of semiconductor layer 2123 may be coupled (e.g., connected) to a second electrode 2124. The first electrode 2125 and the second electrode 2124 are separated (e.g., electrically separated) from each other and do not contact each other.

The first electrode 2125 and the second electrode 2124 may be made of a metal and/or an alloy having high reflectance in a wavelength region of light emitted from the plurality of light emitting diodes 120A, 120B, and 120C. The first electrode 2125 and the second electrode 2124 may include a single film made of a single material selected from Au, tin (Sn), Ni, lead (Pb), Ag, indium (In), Cr, germanium (Ge), silicon (Si), Ti, tungsten (W), and Pt, respectively, or an alloy including (e.g., being) at least two types (e.g., kind) of materials, or a multiple film made of a combination thereof.

The micro-light-emitting diode may have a width of about 20 μm or less, for example about 15 μm or less, about 10 μm or less, or about 5 μm or less, and the micro-light-emitting diode may have a width of about 0.1 μm or more, for example about 0.5 μm or more, or about 1 μm or more. For example, the micro-light-emitting diode may have a width of about 0.1 μm to about 20 μm, for example about 0.5 μm to about 10 μm, or about 0.5 μm to about 5 μm. The width of the micro-light-emitting diode may be a length in a direction substantially normal (e.g., perpendicular) to the moving direction of light (direction D1 or D2 in FIG. 1). For example, the width of the micro-light-emitting diode may be in a horizontal direction. In some embodiments, the width of the micro-light-emitting diode may refer to a smaller width of a horizontal width and a vertical width.

Figure 7:
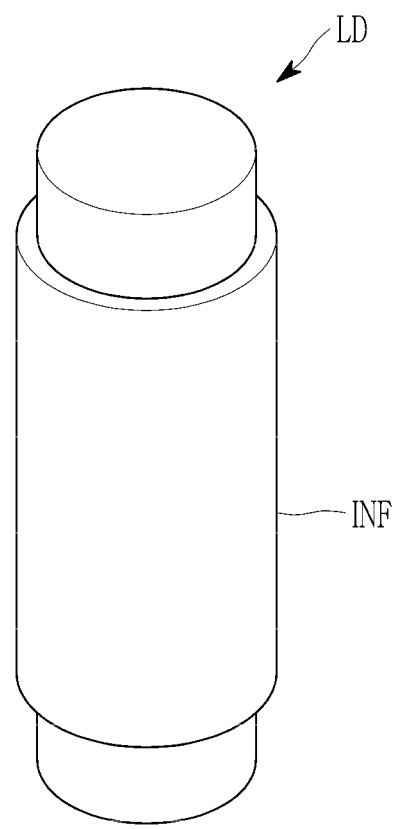
FIGS. 7 and 8 are perspective and cross-sectional views, respectively, illustrating examples of a nano-light-emitting diode.
Figure 8:
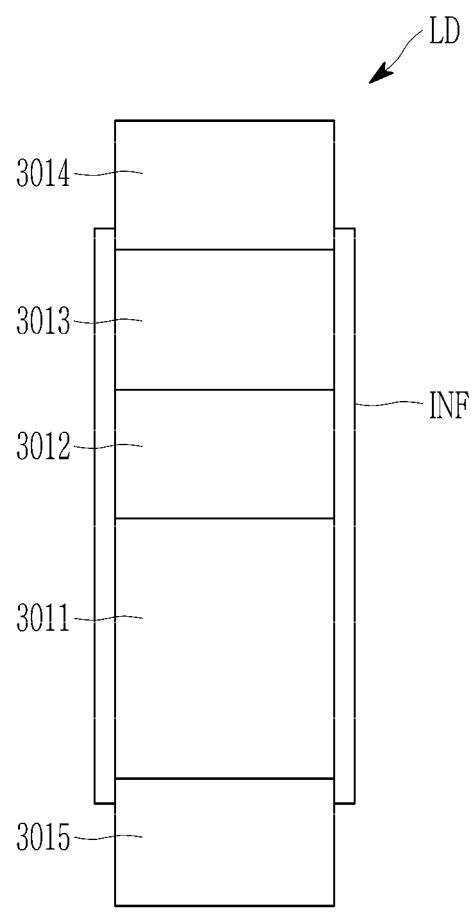

FIGS. 7 and 8 are perspective and cross-sectional views, respectively, illustrating an example of a nano-light-emitting diode.

Although the rod-shaped nano light emitting diode LD having a circular column shape (e.g., a cylindrical shape) is illustrated in FIGS. 7 and 8, the type (e.g., kind) and/or shape of the nano-light-emitting diode LD is not limited thereto.

Referring to FIGS. 7 and 8, the nano-light-emitting diode LD includes (e.g., is) a first conductive type (e.g., kind) of semiconductor layer 3011 and a second conductive type (e.g., kind) of semiconductor layer 3013, and an active layer 3012 between the first and second conductive types of semiconductor layers 3011 and 3013. As an example, the nano-light-emitting diode LD may be formed of a stack in which the first conductive type of semiconductor layer 3011, the active layer 3012, and the second conductive type of semiconductor layer 3013 are sequentially stacked along one direction.

For example, the nano-light-emitting diode LD may be a rod-shaped light emitting diode manufactured into a rod shape. Herein, the rod shape may encompass a rod-like shape and a bar-like shape that is longer in the longitudinal direction than in the width direction (e.g., the aspect ratio is greater than about 1), such as a circular column or a polygonal column, and the shape of the cross-section is not particularly limited. For example, a length (L) of the nano-light-emitting diode LD may be larger than a diameter (D) (or a width of the cross-section).

The nano-light-emitting diode LD may have a size as small as a nano-scale to a micro-scale, for example, a diameter (D) and/or a length (L) of the nano-light-emitting diode LD may be in a nano-scale range to a micro-scale range (e.g., in a nano-scale range or in a micro-scale range). For example, the nano-light-emitting diode LD may have a length of about 1 nm to about 10 μm, for example, about 10 nm to about 10 μm, or about 100 nm to about 10 μm. In addition, the nano-light-emitting diode LD may have an aspect ratio of about 1.2 to about 100.

The first conductive type of semiconductor layer 3011 may include at least one n-type (e.g., n-doped) semiconductor layer. The thickness of the first conductive type of semiconductor layer 3011 may be about 50 nm to about 5 µm, for example, about 50 nm to about 500 nm, but is not limited thereto.

The active layer 3012 may be disposed on the first conductive type of semiconductor layer 3011, and the active layer 3012 may be formed in a single or multiple quantum well structure. For example, a cladding layer doped with a conductive dopant may be formed on and/or under the active layer 3012. The thickness of the active layer 3012 may be about 10 nm to about 200 nm, but is not limited thereto.

The second conductive type of semiconductor layer 3013 may be disposed on the active layer 3012, and the second conductive type of semiconductor layer 3013 may include a semiconductor layer having a type (e.g., kind) that is different from that of the first conductive type of semiconductor layer 3011. For example, the second conductive type of semiconductor layer 3013 may include at least one p-type (e.g., p-doped) semiconductor layer. The thickness of the second conductive type of semiconductor layer 3013 may be about 50 nm to about 500 nm, but is not limited thereto.

For example, the nano-light-emitting diode LD may further include an insulating film INF provided on a surface. The insulating film INF may be formed on the surface of the nano-light-emitting diode LD so as to be around or surround (e.g., partially or entirely surround) at least the outer circumferential surface of the active layer 3012. In addition, a region of the first and second conductive types of semiconductor layers 3011 and 3013 may be further surrounded (e.g., partially or entirely surrounded), for example, by the insulating film INF. However, the insulating film INF may expose both ends of the nano-light-emitting diode LD having different polarities. The insulating film INF may include (e.g., be) at least one insulating material selected from $SiO_2$, $Si_3N_4$, $Al_2O_3$, and $TiO_2$, but is not limited thereto.

For example, the nano-light-emitting diode LD may further include at least one first electrode layer 3014 disposed on an end of the second conductive type of semiconductor layer 3013 and/or at least one other second electrode layer 3015 disposed on an end of the first conductive type of semiconductor layer 3011. In some embodiments, the insulating film INF may expose at least a portion of the first electrode layers 3014 and at least a portion of the second electrode layers 3015.

Each of the first and second electrode layers 3014 and 3015 may be an ohmic contact electrode, but is not limited thereto. The first and second electrode layers 3014 and 3015 may be substantially transparent and/or translucent. Accordingly, light generated by the nano-light-emitting diode LD may pass through the first and second electrode layers 3014 and 3015 and be emitted to the outside of the nano-light-emitting diode LD. Each of the first and second electrode layers 3014 and 3015 may have a thickness of about 1 nm to about 200 nm, but is not limited thereto.

For example, the nano-light-emitting diode LD may further include additional constituent elements in addition to the first conductive type of semiconductor layer 3011, the active layer 3012, the second conductive type of semiconductor layer 3013, and the insulating film INF. For example, the nano-light-emitting diode LD may further include at least one selected from a phosphor layer, an active layer, and/or a semiconductor layer which are disposed on an end side of the first conductive type of semiconductor layer 3011, the active layer 3012, and/or the second conductive type of semiconductor layer 3013.

Meanwhile, referring again to FIG. 2, a protective layer 121 may be disposed on the plurality of light emitting diodes 120A, 120B, and 120C. The protective layer 121 may include (e.g., be) an inorganic material and/or an organic material. When the protective layer 121 includes (e.g., is) an inorganic material, the inorganic material may include (e.g., be) a silicon oxide (e.g., silicon dioxide) and/or a silicon nitride. The protective layer 121 may planarize the upper surface while covering the plurality of light emitting diodes 120A, 120B, and 120C.

A partition wall 160 may be disposed on the protective layer 121. The partition wall 160 may have a grid shape extending along the D1 and D2 directions of FIG. 1.

The partition wall 160 may include (e.g., be) a base resin, a coupling agent, and/or a photoinitiator. The base resin may be made of various suitable resin compositions, which may be generally referred to as binders. Meanwhile, the partition wall 160 may not include (e.g., be) a black component or may include (e.g., be) a black component. The black component may include (e.g., be) a black dye and/or a black pigment. The black component may include (e.g., be) carbon black, a metal such as chromium, and/or an oxide thereof. When the partition wall 160 includes (e.g., is) a black component, the absorbance of the partition wall 160 may be about 0.15 to about 0.5 based on a thickness (e.g., a thickness of the partition wall 160) of about 1 µm.

The partition wall 160 may divide the first pixel (B), the second pixel G, and the third pixel (R) to prevent or block the light supplied from the light emitting unit 120 to (e.g., towards) the quantum dot color conversion unit 130 from leaking to other pixel areas, and the partition wall 160 may guide the blue light emitted from the first light emitting diode 120A, the second light emitting diode 120B, and the third light emitting diode 120C to be supplied to an upper portion (e.g., an upper portion of the quantum dot color conversion unit 130).

The quantum dot color conversion unit 130 may be disposed in a space spaced apart by (e.g., defined by) the partition wall 160. The quantum dot color conversion unit 130 may convert and emit light incident from the plurality of light emitting diodes 120A, 120B, and 120C by utilizing (e.g., using) quantum dots 3.

The quantum dot color conversion unit 130 may include a first quantum dot color conversion layer 130G that converts the second blue light into third light, a second quantum dot color conversion layer 130R that converts the second blue light into fourth light having a longer wavelength than the third light, and a transmission layer 140 that transmits the first blue light. For example, the third light may be green light, and the fourth light may be red light.

The first quantum dot color conversion layer 130G may include green quantum dots 3G. Accordingly, the incident blue light may be converted into green light and then emitted. The second quantum dot color conversion layer 130R may include red quantum dots 3R. Accordingly, the incident blue light may be converted into red light and then emitted.

The quantum dots 3 included in the first quantum dot color conversion layer 130G or the second quantum dot color conversion layer 130R may independently include a Group III-VI semiconductor compound; a Group II-VI semiconductor compound; a Group III-V semiconductor compound; a Group III-VI semiconductor compound; a Group semiconductor compound; a Group IV-VI semiconductor compound; a Group I-II-IV-VI semiconductor compound; a Group IV element and/or compound; or a combination thereof.

The Group III-VI semiconductor compound may include (e.g., be) a binary element compound such as $In_2S_3$; a ternary element compound such as AgInS, AgInS$_2$, CuInS, and/or CuInS$_2$; or a combination thereof.

The Group II-VI semiconductor compound may include (e.g., be) a binary element compound such as CdS, CdSe, CdTe, ZnS, ZnSe, ZnTe, ZnO, HgS, HgSe, HgTe, MgSe, MgS, and/or a mixture thereof; a ternary element compound such as AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or a mixture thereof; and/or a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, and/or a mixture thereof. The Group II-VI semiconductor compound may further include (e.g., be) a Group III metal.

The Group III-V semiconductor compound may include (e.g., be) a binary element compound such as GaN, GaP, GaAs, GaSb, AlN, AlP, AlAs, AlSb, InN, InP, InAs, InSb, and/or a mixture thereof; a ternary element compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or a mixture thereof; and/or a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or a mixture thereof. The Group III-V semiconductor compound may further include (e.g., be) a Group II element. Such a quantum dot 3 may include (e.g., be) InZnP.

The Group III-VI semiconductor compound may include (e.g., be) a binary element compound such as GaS, GaSe, Ga$_2$Se$_3$, GaTe, InS, InSe, In$_2$Se$_3$, InTe, and/or the like; a ternary element compound such as InGaS$_3$ and/or InGaSe$_3$; or a combination thereof.

The Group IV-VI semiconductor compound may include (e.g., be) a binary element compound such as SnS, SnSe, SnTe, PbS, PbSe, PbTe, and/or a mixture thereof; a ternary element compound such as SnSeS, SnSeTe, SnSTe, PbSeS, PbSeTe, PbSTe, SnPbS, SnPbSe, SnPbTe, and/or a mixture thereof; and/or a quaternary element compound such as SnSSeTe, SnPbSSe, SnPbSeTe, and/or SnPbSTe.

The Group I-III-VI semiconductor compound may include (e.g., be) AgInS, AgInS$_2$, AgGaO$_2$, AgAlO$_2$, CuGaO$_2$, CuInSe$_2$, CuInS$_2$, CuInGaSe, and/or CuInGaS, but is not limited thereto.

The Group I-II-IV-VI semiconductor compound may include (e.g., be) CuZnSnSe and/or CuZnSnS, but is not limited thereto.

The Group IV element and/or semiconductor compound may include (e.g., be) a single element such as Si, Ge, and/or a mixture thereof; and/or a binary element compound such as SiC, SiGe, and/or a mixture thereof.

The binary element compound, the ternary element compound, and/or the quaternary element compound may be present in a particle having a substantially uniform concentration, or may be present in a particle having different concentration distributions in the same particle.

The quantum dot 3 may include (e.g., be) a core including (e.g., being) a first semiconductor nanocrystal, and a shell including (e.g., being) a second semiconductor nanocrystal disposed on at least a portion (e.g., all of the surface) of the core surface and having a composition different from that of the first semiconductor nanocrystal. An alloyed layer may be present or may not be present at the interface between the core and the shell. The alloyed layer may be a homogeneous alloy or may be a gradient alloy. In the gradient alloy, a concentration of elements present in the shell may change in a radial direction, for example, may have a concentration gradient that decreases or increases toward the center. In addition, the shell may be a multilayer shell including two or more layers, and two adjacent layers (e.g., two adjacent layers of the two or more layers included in the shell) may have different compositions. In a multilayer shell, one or more layers may independently include (e.g., be) semiconductor nanocrystals having a single composition. In a multilayer shell, one or more layers may include (e.g., be) semiconductor nanocrystals which are alloyed independently from each other. In a multilayer shell, one or more layers may have a concentration gradient that changes radially in terms of the composition of the semiconductor nanocrystals.

In the core-shell structured quantum dot 3, the bandgap energy of the shell material may be greater than that of the core material, but is not limited thereto. The bandgap energy of the shell material may be smaller than that of the core material. In the case of the multilayer shell, the energy bandgap of the outermost layer material of the shell may be greater than those of the core and the inner layer material(s) of the shell (e.g., layers that are closer to the core). In the case of the multilayer shell, a semiconductor nanocrystal of each layer is selected to have an appropriate bandgap, thereby effectively showing (e.g., providing) a quantum confinement effect.

Examples of the shell of the quantum dot 3 may include (e.g., be) a metal oxide and/or a non-metal oxide, a semiconductor compound, or a combination thereof.

Examples of the metal oxide and/or non-metal oxides may include (e.g., be) a binary element compound such as SiO$_2$, Al$_2$O$_3$, TiO$_2$, ZnO, MnO, Mn$_2$O$_3$, Mn$_3$O$_4$, CuO, FeO, Fe$_2$O$_3$, Fe$_3$O$_4$, CoO, Co$_3$O$_4$, and NiO; a ternary element compound such as MgAl$_2$O$_4$, CoFe$_2$O$_4$, NiFe$_2$O$_4$, and/or CoMn$_2$O$_4$; or a combination thereof. Examples of the semiconductor compound may include (e.g., be), as described herein, a Group III-VI semiconductor compound; a Group II-VI semiconductor compound; a Group III-V semiconductor compound; a Group III-VI semiconductor compound; a Group I-III-VI semiconductor compound; a Group IV-VI semiconductor compound; or a combination thereof. For example, the semiconductor compound may include (e.g., be) CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof. For example, the quantum dots 3 may include (e.g., be) indium, zinc, or a combination thereof. The quantum dot 3 may include (e.g., be) InP, InZnP, InGaP, ZnS, ZnSe, ZnSeS, ZnSeTe, or a combination thereof. The quantum dots 3 may include (e.g., be) ZnSe, ZnS, ZnSeS, ZnSeTe, or a combination thereof in the outermost layer of the shell.

The emission wavelength of the quantum dots 3 may be appropriately and suitably selected. For example, the maximum photoluminescence peak of the quantum dot 3 may exist in a wavelength region from an ultraviolet region to a near infrared region. The maximum photoluminescence peak wavelength of the quantum dot 3 may exist in the range of about 420 nm to about 750 nm (e.g., about 460 nm to about 700 nm). In the case of the green light emitting quantum dot 3 (e.g., the green quantum dots 3G), the quantum dot may exhibit a maximum emission peak wavelength within about 500 nm to about 550 nm, for example, about 510 nm to about 550 nm. In the case of the red light emitting quantum dot 3 (e.g., the red quantum dots 3R), the quantum dot may exhibit a maximum emission peak wavelength within a range of about 600 nm to about 650 nm, for example, about 610 nm to about 650 nm. In the case of the blue light emitting quantum dot 3, the quantum dot may exhibit a maximum emission peak wavelength within a range of about 440 nm to about 480 nm, for example, about 450 nm to about 480 nm, about 440 nm to about 470 nm, or about 450 nm to about 470 nm.

The quantum dot 3 may exhibit a relatively full width at half maximum (FWHM) in a photoluminescence spectrum. For example, the quantum dot 3 may have a FWHM of about 45 nm or less, such as about 44 nm or less, about 43 nm or less, about 42 nm or less, about 41 nm or less, about 40 nm or less, about 39 nm or less, about 38 nm or less, about 37 nm or less, about 36 nm or less, or about 35 nm or less in its photoluminescence spectrum. The quantum dot 3 may have a quantum yield of about 10% or more, for example about 20% or more, about 30% or more, about 40% or more, about 50% or more, about 60% or more, about 70% or more, about 80% or more, about 90% or more, or even about 100%.

The quantum dot 3 may have a size of about 1 nm or more and about 100 nm or less (e.g., a particle diameter or in the case of a non-spherical particle, a particle diameter or breadth calculated from a two-dimensional area found, for example, in electron microscopy analysis). For example, the quantum dot 3 may have a size of about 1 nm to about 50 nm, for example, about 2 nm (or about 3 nm) to about 35 nm. For example, the size of the quantum dot 3 may be about 1 nm or more, about 2 nm or more, about 3 nm or more, about 4 nm or more, about 5 nm or more, about 6 nm or more, about 7 nm or more, about 8 nm or more, about 9 nm or more, or about 10 nm or more. For example, the size of the quantum dot 3 may be about 50 nm or less, about 40 nm or less, about 30 nm or less, about 25 nm or less, about 20 nm or less, about 19 nm or less, about 18 nm or less, about 17 nm or less, about 16 nm or less, or about 15 nm or less.

The quantum dot 3 may have any suitable shape. For example, the shape of the quantum dot 3 may include a spherical shape, a polyhedral shape, a pyramidal shape, a multi-pod shape, a cubic shape, a nanotube shape, a nanowire shape, a nanofiber shape, a nanosheet shape, a nanoplate shape, or a combination thereof.

The quantum dot 3 may be commercially or generally available, or the quantum dot 3 may be synthesized by any method. The quantum dot 3 may be synthesized by a wet chemical process, an organometallic chemical vapor deposition process, a molecular beam epitaxy process, and/or a similar process. For example, the quantum dot 3 may be colloidal particles synthesized through a wet chemical process. In a wet chemical process, precursor materials may be reacted in an organic solvent to grow crystal particles, and in this case, the organic solvent or ligand compound is naturally coordinated on a surface of the quantum dot 3 to control the growth of the crystal. When the crystal grows, the organic solvent naturally acts as a dispersant coordinated on the surface of the quantum dot crystal and controls the growth of the crystal. Therefore, the growth of quantum dot particles may be controlled through a process that is easier and more inexpensive than vapor deposition methods such as metal organic chemical vapor deposition (MOCVD) or molecular beam epitaxy (MBE).

Specific types (e.g., kinds) of organic solvents and ligand compounds are known or generally available. In a wet chemical process, recovery of the synthesized colloidal quantum dots may include adding a non-solvent to a reaction solution and centrifuging the final mixture. This recovery process may lead to removal of at least some of the organic materials coordinated on the surface of the quantum dot 3. Examples of the non-solvent may include (e.g., be), but are not limited to, acetone, ethanol, methanol, and/or the like.

The quantum dot 3 may have an organic ligand bound to its surface. In an embodiment, the organic ligand may have a hydrophobic moiety. The organic ligand may include (e.g., be) $RCOOH$, $RNH_2$, $R_2NH$, $R_3N$, $RSH$, $R_3PO$, $R_3P$, $ROH$, $RCOOR'$, $RPO(OH)_2$, $R_2POOH$ (wherein R and R' are independently hydrogen, a C5 to C24 substituted or unsubstituted aliphatic hydrocarbon group, for example a C5 to C24 alkyl group, a C5 to C24 alkenyl group, or a C5 to C20 aromatic hydrocarbon group, for example a C6 to C20 aryl group, provided that at least one is not hydrogen), or a combination thereof. Examples of the organic ligand may include (e.g., be) a thiol compound such as methane thiol, ethane thiol, propane thiol, butane thiol, pentane thiol, hexane thiol, octane thiol, dodecane thiol, hexadecane thiol, octadecane thiol, benzyl thiol, and/or the like; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and/or the like; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and/or the like; phosphine compounds such as methyl phosphine, ethyl phosphine, propyl phosphine, butyl phosphine, pentyl phosphine, octylphosphine, dioctyl phosphine, tributylphosphine, trioctylphosphine, and/or the like; phosphine compounds and/or oxide compounds thereof such as methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, trioctylphosphine oxide; diphenyl phosphine, a triphenylphosphine compound, and/or an oxide compound thereof; a C5 to C20 (mono- or di-) alkylphosphinic acid, a hexylphosphonic acid such as (mono- or di-)hexylphosphinic acid, a (mono- or di-) octylphosphinic acid, a (mono- or di-) dodecanephosphinic acid, a (mono- or di-) tetradecanephosphinic acid, a (mono- or di-) hexadecanephosphinic acid, a (mono- or di-) octadecanephosphinic acid, and/or the like; and/or a C5 to C20 alkyl phosphonic acid such as octylphosphonic acid, dodecanephosphonic acid, tetradecanephosphonic acid, hexadecanephosphonic acid, and/or octadecanephosphonic acid; but is not limited thereto. The quantum dot 3 may include (e.g., be) organic ligands alone or as a mixture of two or more.

Meanwhile, the transmission layer 140 may emit incident light substantially as it is without converting the incident light. In the transmission layer 140, for example, blue light may be incident and blue light may be emitted substantially as it is.

The transmission layer 140 may include (e.g., be) a transparent resin that transmits blue light. The transmission layer 140 disposed in the region emitting blue light does not include a separate quantum dot 3, and the transmission layer 140 allows the incident blue light to pass substantially as it is. In some embodiments, the transmission layer 140 does not include a quantum dot color conversion material.

The transmission layer 140 may further include (e.g., be) at least one selected from a dye and a pigment. The transmission layer 140 including (e.g., being) a dye and/or pigment may reduce reflection of external light and provide blue light with improved color purity.

The transmission layer 140 may be omitted, and in this case, an overcoat layer 170 may fill the empty space of the transmission layer 140 (e.g., a space occupied by the transmission layer 140 in embodiments where the transmission layer 140 is included) instead.

The transmission layer 140 may have a light transmittance of about 50% or more, for visible light, for example, about 60% or more, about 70% or more, about 80% or more, about 90% or more, or even about 100%.

At least one selected from the first quantum dot color conversion layer 130G, the second quantum dot color conversion layer 130R, and the transmission layer 140 may further include a scattering body (e.g., scattering particles). The content (e.g., the composition) of each scattering body included in the first quantum dot color conversion layer 130G, the second quantum dot color conversion layer 130R, and/or the transmission layer 140 may be different. The scattering body may increase the amount of light emitted or received by being converted or passed through the first quantum dot color conversion layer 130G, the second quantum dot color conversion layer 130R, and/or the transmission layer 140, and the scattering body may uniformly provide the front and side luminances. In some embodiments, the scattering particles may increase a path length of light passing through the first quantum dot color conversion layer 130G, the second quantum dot color conversion layer 130R, and/or the transmission layer 140, and the scattering particles may increase the conversion rate of light passing through the first quantum dot color conversion layer 130G and/or the second quantum dot color conversion layer 130R.

The scattering body may include (e.g., be) any material for evenly scattering incident light. For example, the scattering body may include (e.g., be) at least one selected from $TiO_2$, $ZrO_2$, $Al_2O_3$, $In_2O_3$, ZnO, $SnO_2$, $Sb_2O_3$, and ITO.

The first quantum dot color conversion layer 130G, the second quantum dot color conversion layer 130R, and/or the transmission layer 140 may include (e.g., be), for example, a photosensitive resin, and may be formed through a photolithography process.

An overcoat layer 170 may be disposed on the quantum dot color conversion unit 130. The overcoat layer 170 may include (e.g., be) an inorganic material and/or an organic material. When the overcoat layer 170 includes (e.g., is) an inorganic material, the inorganic material may include (e.g., be) a silicon oxide (e.g., silicon dioxide) and/or a silicon nitride.

The thickness of the overcoat layer 170 may vary depending on the thickness of the quantum dot color conversion unit 130, the target thickness (e.g., a desired thickness) of the display device 1, and the luminance and/or heat generation of the light emitting diodes 120A, 120B, and 120C. In some embodiments, the thickness of the overcoat layer 170 may be about 1 μm or more, for example, about 2 μm or more, about 3 μm or more, about 4 μm or more, or about 5 μm or more. In some embodiments, the thickness of the overcoat layer 170 may be about 10 μm or less, for example about 9 μm or less, or about 8 μm. For example, the thickness of the overcoat layer 170 may be about 1 μm to about 10 μm, for example, about 1 μm to about 9 μm, about 1 μm to about 8 μm, about 2 μm to about 8 μm, about 3 μm to about 8 μm, about 4 μm to about 8 μm, or about 5 μm to about 8 μm.

When the thickness of the overcoat layer 170 satisfies the above-described range, the display device 1 may be flattened easily (e.g., may be substantially flat), while the quantum dot color conversion unit 130 may absorb and/or block heat that may be transmitted from the substrate 110 to prevent or reduce deterioration of the quantum dot color conversion unit 130.

In some embodiments, the overcoat layer 170 may be omitted in consideration of a surface shape (e.g., a shape of an upper surface) of the quantum dot color conversion unit 130.

A color filter unit 190 may be disposed on the overcoat layer 170. The color filter unit 190 may include (e.g., be) a material capable of absorbing visible light in a set or predetermined wavelength region (e.g., wavelength range). A material capable of absorbing visible light in a set or predetermined wavelength region may include (e.g., be) an inorganic material and/or an organic material. Accordingly, color purity of light finally emitted from each pixel of the display device 1 may be improved.

For example, the blue light emitted from the light emitting unit 120 meets the quantum dots 3 of the quantum dot color conversion unit 130 and is converted into green light and/or red light. At this time, the scattering body included in the first quantum dot color conversion layer 130G and/or the second quantum dot color conversion layer 130R increases a probability of meeting the blue light and the quantum dots 3 (e.g., increases a probability of the blue light being converted by the quantum dots 3), and the scattering body included in the transmission layer 140 scatters blue light that comes (e.g., directly comes) up (e.g., comes from the first light emitting diode 120A), so that it may exhibit a Lambertian light emission effect. Lambertian emission may solve or improve the viewing angle issue. At this time, the color filter unit 190 absorbs the blue light that has passed through without meeting the quantum dot 3 to remove noise light, thereby increasing color purity of final red, green, and blue light emission.

The color filter unit 190 may include (e.g., be), for example, a photosensitive resin, and may be formed through a photolithography process.

The color filter unit 190 may include a first color filter 190B disposed in the first pixel B, a second color filter 190G disposed in the second pixel G, and/or a third color filter 190R disposed in the third pixel R.

Each of the first to third color filters 190B, 190G, and 190R may be disposed so as to be overlapped with each of the first to third light emitting diodes 120A, 120B, and 120C, respectively. The first to third color filters 190B, 190G, and 190R may be repeatedly disposed along, for example, the D1 direction.

The first color filter 190B may have a light absorption rate of about 50% or more, for example, about 60% or more, about 70% or more, about 80% or more, about 90% or more, or even about 100%, for visible light in a wavelength region other than blue light.

The second color filter 190G may have a light absorption rate of about 50% or more, for example, about 60% or more, about 70% or more, about 80% or more, about 90% or more, or even about 100%, for visible light in a wavelength region other than green light.

The third color filter 190R may have a light absorption rate of about 50% or more, for example, about 60% or more, about 70% or more, about 80% or more, about 90% or more, or even about 100%, for visible light in a wavelength region other than red light.

The first to third color filters 190B to 190R may be spaced apart from each other by a black matrix 191. The black matrix 191 may have a grid shape extending along the D1 direction and the D2 direction of FIG. 1. The black matrix 191 may be an organic material, an inorganic material, and/or a metal.

The black matrix 191 may divide the first pixel (B), the second pixel (G), and the third pixel (R) to prevent or reduce color mixing of light emitted from the quantum dot color conversion unit 130, while guiding light supplied to the first color filter 190B, the second color filter 190G, and the third color filter 190R to be emitted to the outside of the display device 1.

The height (e.g., thickness) of the black matrix 191 is illustrated to be lower than the first color filter 190B, the second color filter 190G, and the third color filter 190R, but is not limited thereto, and the height of the black matrix 191 may be the same as or greater than the heights of the first color filter 190B, the second color filter 190G, and the third color filter 190R.

Figure 9:
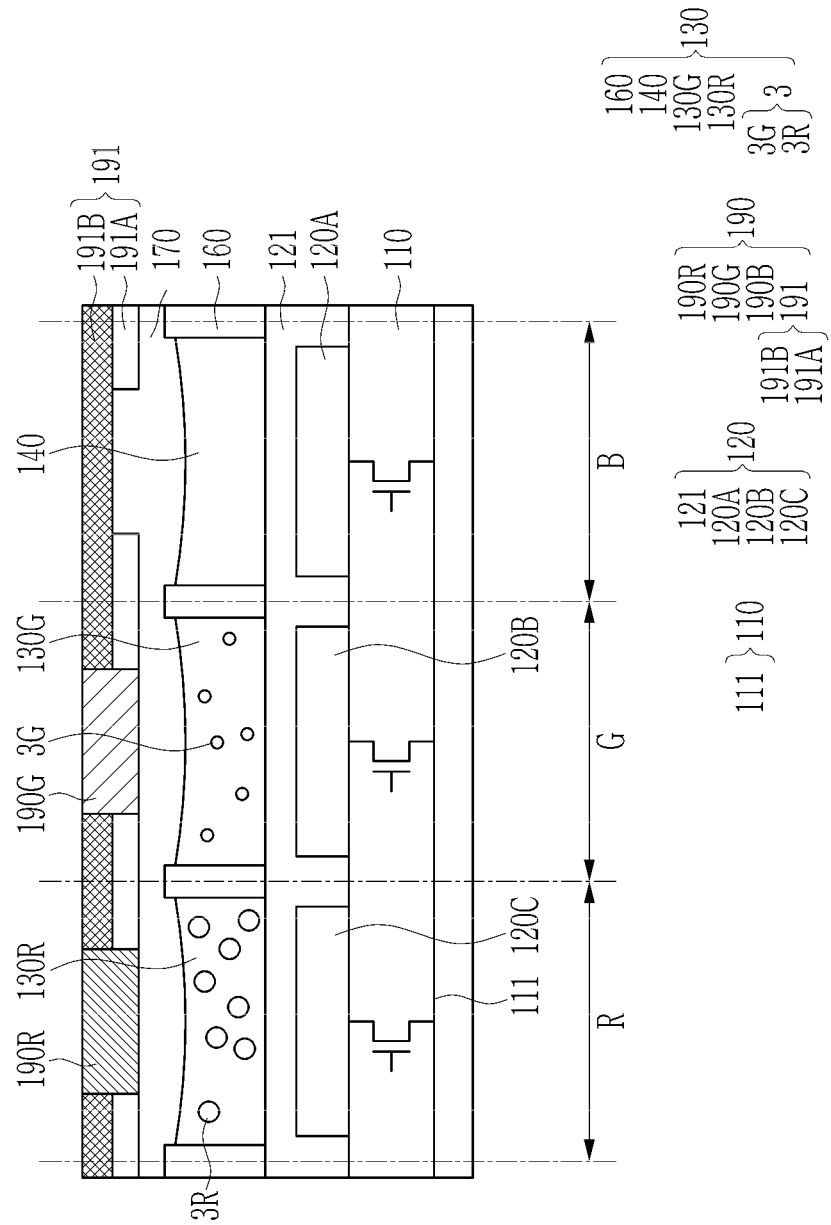
FIG. 9 is a schematic cross-sectional view of a display device according to another embodiment.

FIG. 9 is a schematic cross-sectional view of a display device according to another embodiment.

Referring to FIG. 9, the black matrix 191 may include a first black matrix layer 191A and a second black matrix layer 191B.

The first black matrix layer 191A may be disposed on the overcoat layer 170, and the second black matrix layer 191B may be disposed on the first black matrix layer 191A.

The first black matrix layer 191A and the second black matrix layer 191B may have a grid shape extending along the direction D1 and direction D2 of FIG. 1 so that the first color filter 190B, the second color filter 190G, and the third color filter 190R may be spaced apart from each other.

The second black matrix layer 191B may include (e.g., be) the same material as the first color filter 190B. Because the second black matrix layer 191B including (e.g., being) the same material as the first color filter 190B may have a small difference in refractive index (index of refraction) from the substrate, which may be disposed outside the second black matrix layer 191B, compared with the first black matrix layer 191A, reflectance of external light may be reduced.

In this case (e.g., embodiment), the first color filter 190B may be omitted, and the second black matrix layer 191B may fill the empty space of the first color filter 190B. For example, the second black matrix layer 191B may function as a blue color filter, and at least a portion of the second black matrix layer 191B may overlap the first light emitting diode 120A.

The first black matrix layer 191A may be a conventional black matrix. The first black matrix layer 191A may have a black color. The first black matrix layer 191A may include (e.g., be) a base resin and a black coloring agent mixed therewith. The first black matrix layer 191A may have absorbance of about 1 to about 3 based on a thickness of about 1 μm.

While this disclosure has been described in connection with some embodiments, it is to be understood that the present disclosure is not limited to the disclosed embodiments. On the contrary, it is intended to cover various suitable modifications and equivalent arrangements included within the spirit and scope of the appended claims and equivalents thereof.

| Description of symbols | |
|---|---|
| 1: display device | 3: quantum dot |
| 3R: red quantum dot | 3G: green quantum dot |
| 110: substrate | 111: pixel circuit unit |
| 120: light emitting unit | 120A, 120B, 120C: first, second, and third light emitting diode |
| 121: protective layer | |
| 130G and 130R: first and second quantum dot color conversion layers | 130: quantum dot color conversion unit |
| 140: transmission layer | 160: partition wall |
| | 190: color filter unit |

| Description of symbols | |
|---|---|
| 170: overcoat layer | 191A: first black matrix layer |
| 190B, 190G, 190R: first, second, and third color filter | |
| 191: black matrix | |
| 191B: second black matrix layer | |
| B, G, R: first, second, and third pixel | |

What is claimed is:

1. A display device, comprising:
   a light emitting unit comprising a first light emitting diode to emit first blue light, and a second light emitting diode to emit second blue light, the second blue light being different from the first blue light in central wavelength, and
   a quantum dot color conversion unit comprising a quantum dot color conversion layer on and overlapping the second light emitting diode,
   wherein the central wavelength of the second blue light is 390 nm to 440 nm, and
   wherein the quantum dot color conversion unit comprises a first quantum dot color conversion layer to convert the second blue light into third light, and a second quantum dot color conversion layer to convert the second blue light into fourth light.

2. The display device of claim 1, wherein the second blue light is shorter in central wavelength than the first blue light.

3. The display device of claim 1, wherein the central wavelength of the first blue light is 450 nm to 460 nm.

4. The display device of claim 1, wherein the first light emitting diode and the second light emitting diode are each an organic light emitting diode, a micro-light-emitting diode, or a nano-light-emitting diode.

5. The display device of claim 4, wherein at least one selected from among the first light emitting diode and the second light emitting diode is the organic light emitting diode, and wherein the organic light emitting diode comprises an organic light emitting layer, a first charge transfer region on a first surface of the organic light emitting layer, and a second charge transfer region on a second surface of the organic light emitting layer, the second surface facing oppositely away from the first surface.

6. The display device of claim 4, wherein at least one selected from among the first light emitting diode and the second light emitting diode is the micro-light-emitting diode, and wherein the micro-light-emitting diode comprises a first conductive type of semiconductor layer, a second conductive type of semiconductor layer overlapping the first conductive type of semiconductor layer, and an active layer between the first conductive type of semiconductor layer and the second conductive type of semiconductor layer.

7. The display device of claim 4, wherein at least one selected from among the first light emitting diode and the second light emitting diode is the nano-light-emitting diode, and wherein the nano-light-emitting diode is a nano-sized, rod-shaped light-emitting diode.

8. The display device of claim 1, wherein the light emitting unit comprises a third light emitting diode to emit third blue light.

9. The display device of claim 8, wherein a central wavelength of the third blue light is 450 nm to 460 nm, or 390 nm to 450 nm.

10. The display device of claim 1, wherein the third light is green light, and the fourth light is red light.

11. The display device of claim 1, wherein the quantum dot color conversion layer comprises a quantum dot comprising a Group II-VI semiconductor compound, a Group III-V semiconductor compound, a Group III-VI semiconductor compound, a Group semiconductor compound, a Group IV-VI semiconductor compound, a Group I-II-IV-VI semiconductor compound, a Group IV element, a Group IV compound, or a combination thereof.

12. The display device of claim 11, wherein the quantum dot comprises InP, InZnP, InGaP, ZnS, ZnSe, ZnSeS, ZnSeTe, or a combination thereof.

13. The display device of claim 11, wherein the quantum dot comprises a core comprising a first semiconductor nanocrystal, and a shell on the core and comprising a second semiconductor nanocrystal, the second semiconductor nanocrystal being different in composition from the first semiconductor nanocrystal.

14. The display device of claim 13, wherein the quantum dot comprises ZnSe, ZnS, ZnSeS, ZnSeTe, or a combination thereof in an outermost layer of the shell.

15. The display device of claim 1, wherein the quantum dot color conversion unit further comprises a transmission layer overlapping the first light emitting diode and not comprising a quantum dot color conversion material.

16. The display device of claim 1, wherein the quantum dot color conversion unit further comprises a partition wall between a plurality of quantum dot color conversion layers comprising the quantum dot color conversion layer, the partition wall separating the plurality of quantum dot color conversion layers from each other.

17. The display device of claim 1, further comprising an organic planarization layer on the quantum dot color conversion unit.

18. The display device of claim 1, further comprising a color filter unit comprising a color filter on the quantum dot color conversion unit and overlapping the quantum dot color conversion layer.

19. The display device of claim 1, wherein the light emitting diode is an organic light emitting diode comprising a first light emitting layer, a second light emitting layer on the first light emitting layer, and a first charge generation layer between the first and second light emitting layers.

* * * * *